US011152552B2

(12) United States Patent
Nakai (10) Patent No.: US 11,152,552 B2
(45) Date of Patent: Oct. 19, 2021

(54) LIGHT EMITTING DEVICE (71) Applicant: NICHIA CORPORATION, Anan (JP)

(72) Inventor: Hiroki Nakai, Anan (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/592,214

(22) Filed: Oct. 3, 2019

(65) Prior Publication Data
US 2020/0127179 A1 Apr. 23, 2020

(30) Foreign Application Priority Data

Oct. 18, 2018 (JP) .............................. JP2018-196622

(51) Int. Cl.
H01L 33/62 (2010.01)
H01L 33/52 (2010.01)
H01L 33/48 (2010.01)
H01L 33/64 (2010.01)

(52) U.S. Cl.
CPC ............ *H01L 33/62* (2013.01); *H01L 33/483* (2013.01); *H01L 33/52* (2013.01); *H01L 33/64* (2013.01)

(58) Field of Classification Search
CPC ....... H01L 33/483; H01L 33/52; H01L 33/62; H01L 33/64
See application file for complete search history.

(56) References Cited

U.S. PATENT DOCUMENTS

| 8,203,164 | B2* | 6/2012 | Min | H01L 33/62 |
| | | | | 257/99 |
| 8,740,409 | B2* | 6/2014 | Nakata | H01L 33/62 |
| | | | | 362/249.02 |
| 8,823,040 | B2* | 9/2014 | Takeda | H01L 33/486 |
| | | | | 257/99 |
| 9,453,119 | B2* | 9/2016 | Lu | C08K 7/14 |
| 9,520,386 | B2* | 12/2016 | Song | H01L 25/167 |
| 2001/0030866 | A1* | 10/2001 | Hochstein | F21V 29/70 |
| | | | | 362/294 |
| 2015/0263247 | A1 | 9/2015 | Wada et al. | |
| 2017/0155023 | A1 | 6/2017 | Ide | |

(Continued)

FOREIGN PATENT DOCUMENTS

| JP | 2015-177120 A | 10/2015 |
| JP | 2017-098509 A | 6/2017 |

(Continued)

*Primary Examiner* — Vongsavanh Sengdara
(74) *Attorney, Agent, or Firm* — Global IP Counselors, LLP (57) ABSTRACT A light emitting device includes a substrate, a light emitting element, and a frame. The substrate has a base and a wiring component. The frame surrounds the light emitting element on the substrate and has an inner edge and an outer edge. The wiring component has a first wiring layer constituting at least a part of an outermost surface of the wiring component inside of the outer edge of the frame, and connected to the light emitting element, and a second wiring layer constituting at least a part of the outermost surface of the wiring component outside of the inner edge of the frame, and made from a different material from the first wiring layer. A boundary between the first wiring layer and the second wiring layer on the outermost surface of the wiring component is disposed inside the outer edge of the frame.

16 Claims, 3 Drawing Sheets (56) References Cited

U.S. PATENT DOCUMENTS

2017/0317230 A1* 11/2017 An .................... H01L 33/62
2017/0345985 A1 11/2017 Ide
2017/0358724 A1 12/2017 Shichijo et al.

FOREIGN PATENT DOCUMENTS

| JP | 2017-174763 A | 9/2017 |
| JP | 2017-216315 A | 12/2017 |
| JP | 2017-224691 A | 12/2017 |

* cited by examiner

LIGHT EMITTING DEVICE

CROSS-REFERENCE TO RELATED APPLICATION

This application claims priority to Japanese Patent Application No. 2018-196622 filed on Oct. 18, 2018, the disclosure of which is hereby incorporated herein by reference in its entirety.

BACKGROUND

The present disclosure relates to a light emitting device.

Semiconductor light emitting elements have been used in recent years not only as illumination light sources that replace fluorescent lamps, but also as light sources having good directivity and high luminance in automotive headlights and other such projectors, floodlighting, and so forth.

A light emitting device used in such applications has been proposed, for example, in Japanese Laid-Open Patent Application Publication No. 2015-177120.

With this light emitting device, a plurality of light emitting elements are arranged on a substrate provided with an electrode pattern. The electrode pattern to which the light emitting elements are connected extends outside the sealing member and is used as an external electrode for connection of an external power supply.

SUMMARY

The electrode pattern used as the external electrode may undergo connection failure due to the application of high power over an extended period, depending on the combination of the electrode pattern, and the shape and/or material, etc., of the power feed member such as a wire connected to the electrode pattern.

Accordingly, the present disclosure is to provide a light emitting device that a reliable connection can be ensured over an extended period of time.

The present disclosure includes the following aspect.

A light emitting device includes a substrate, a light emitting element, and a frame. The substrate has a base and a wiring component disposed on a first main surface of the base. The light emitting element is mounted on the wiring component. The frame surrounds the light emitting element on the substrate and has an inner edge and an outer edge on the substrate. The wiring component has a first wiring layer constituting at least a part of an outermost surface of the wiring component inside of the outer edge of the frame, and connected to the light emitting element, and a second wiring layer constituting at least a part of the outermost surface of the wiring component outside of the inner edge of the frame, and made from a different material from a material of the first wiring layer. A boundary between the first wiring layer and the second wiring layer on the outermost surface of the wiring component in plan view is disposed inside the outer edge of the frame.

With the light emitting device disclosed herein, long-term reliability of the connection between the light emitting device and the power feed member from the outside can be realized.

DETAILED DESCRIPTION

The drawings referred to in the following description schematically show embodiments and, therefore, the scale, interval, positional relationship and the like of members may be exaggerated or partially omitted. Further, a plan view and a corresponding cross-sectional view may not coincide with each other in scale or interval of members. Further, in the following description, in principle, identical name and reference character denote an identical or similar member, and the detailed description thereof may be omitted as appropriate.

Light Emitting Device

As shown in FIGS. 1A to 2B, the light emitting device 100 according to an embodiment of the present invention includes a substrate 10 having a base 11 and a wiring component 12 that is disposed on a main surface of the base 11; a light emitting element 20 that is mounted on the wiring component 12; and a frame 41 that surrounds the light emitting element 20 on the substrate 10. The frame 41 has an inner edge and an outer edge on the substrate. The wiring component 12 has a first wiring layer 121 and a second wiring layer 122. The first wiring layer 121 is disposed inside of an outer edge of the frame 41, and is connected to the light emitting element 20. The second wiring layer 122 is disposed outside of the inner edge of the frame 41 and is made from a different material from that of the first wiring layer 121. The boundary between the first wiring layer and the second wiring layer on the outermost surface of the wiring component 12 in plan view is disposed inside the outer edge of the frame 41, more particularly, is disposed inside the outer edge and outside the inner edge of the frame 41.

Figure 1A:
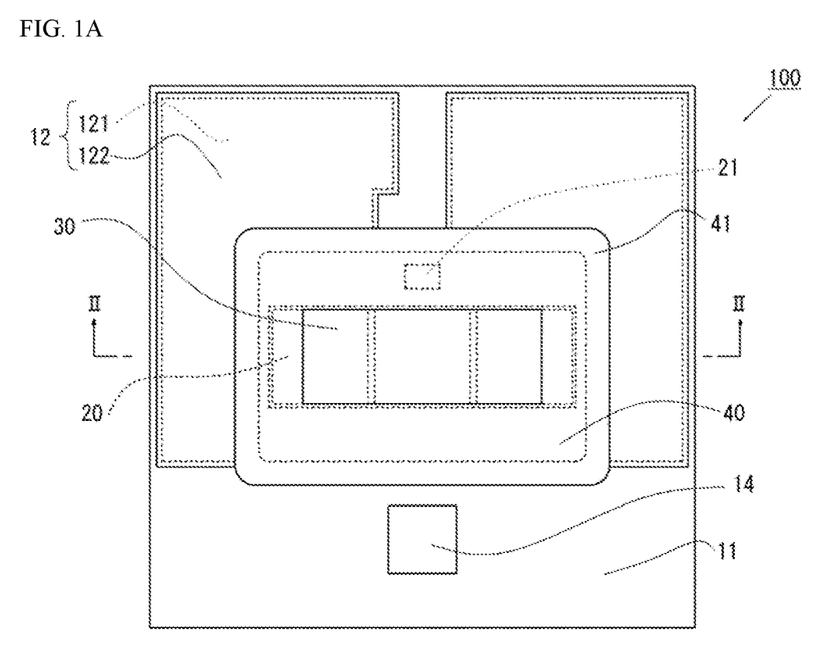
FIG. 1A is a plan view schematically showing the light emitting device according to an embodiment of the present disclosure.

The frame 41 has a substantially rectangular shape in plan view, and is formed such that three sides of the rectangle cover the wiring component 12.

Substrate

The substrate 10 includes the base 11 and the wiring component 12 that is disposed on a main surface of the base 11. The wiring component 12 includes at least one pair of wiring components. Each of the pair of wiring components 12 has the first wiring layer 121, and the second wiring layer 122 which is made of a different material from that of the first wiring layer 121. The first wiring layer 121 and the second wiring layer 122 are disposed such that they overlap at least partially in the height direction of the substrate 10, and are electrically connected to each other. In this embodiment, part of the first wiring layer 121 is covered by the second wiring layer 122. That is, the substrate 10 includes the first wiring layer 121 and the second wiring layer 122 in that order starting from the base 11 side, one part of the first wiring layer 121 is covered by the second wiring layer 122, and the other part is exposed from the second wiring layer 122.

The upper surface of the substrate 10 is divided by the frame 41 (discussed below) into an element mounting area, which is the area where the light emitting element 20 is mounted, and an external connection area, which is the area connected to an external power feed member through which power is fed to the light emitting element 20 from the outside. The boundary between the element mounting area and the external connection area is defined by the outer edge of the frame 41. The wiring component 12 is continuously disposed on the main surface of the base 11 from the element mounting area to the external connection area. The wiring component 12 has the first wiring layer 121 on its outermost surface in the element mounting area, and has the second wiring layer 122 on its outermost surface in the external connection area.

In the element mounting area, the first wiring layer 121 disposed on the outermost surface of the wiring component 12 is connected to the electrode of the light emitting element 20 and covered by a covering member 40 and the frame 41, which will be described below along with the light emitting element 20. In the external connection area, the second wiring layer 122 disposed on the outermost surface of the wiring component 12 is exposed to constitute an upper surface of the light emitting device 100, and is used as an external electrode for feeding power to the light emitting device 100 from the outside.

Here, it is preferable for the first wiring layer 121 to constitute the outermost surface of the wiring component 12 only in the element mounting area, without being covered by the second wiring layer 122. In other words, in the external connection area, the outermost surface of the wiring component 12 is preferably formed exclusively by the second wiring layer. That is, the boundary between the first wiring layer and the second wiring layer on the outermost surface of the wiring component 12 is preferably located inside the outer edge of the frame 41 (that is, in the element mounting area).

With this configuration, the wiring component 12 is provided that make use of different materials for the first wiring layer 121 (on the outermost surface of the element mounting area) and the second wiring layer 122 (on the outermost surface of the external connection area). Consequently, a wiring layer suitable for the joining material with the light emitting element and a wiring layer suitable for the external power feed member can be disposed in the element mounting area and the external connection area, respectively. As a result, the light emitting element and the substrate, and the external power feed member and the substrate can be joined more securely and strongly, respectively.

Base

The base 11 can be any of the substrates normally used for mounting the light emitting element 20 and the like. The base 11 is made of, for example, glass, glass epoxy, resin such as thermoplastic resin and thermosetting resin, ceramic, paper phenol, paper epoxy, glass composite, low temperature co-fired ceramic (LTCC), metal member formed with these insulating members, etc. It is particularly preferable to use one made ceramic having high heat resistance and weather resistance. The ceramic material includes alumina, aluminum nitride, mullite and the like. These ceramic materials may be combined with an insulating material such as BT resin, glass epoxy or epoxy resin.

The shape and size of the base 11 can be appropriately set according to the design of the light emitting device. One example is a plate-shaped base in which the surface of the base is preferably flat. The planar shape of the base 11 may be quadrangular, circular, elliptical, polygonal, or the like, but a substantially rectangular shape is preferable from the standpoint of ease of machining.

Wiring Component

As described above, the upper surface of the substrate 10 is divided into the element mounting area and the external connection area. The element mounting area is the area where the light emitting element 20 is mounted. However, the element mounting area includes not only the junction with the light emitting element 20, but also the surrounding area. The external connection area is the area extending from the element mounting area for ensuring an electrical connection with the external member. In the example shown in FIG. 1A, the boundary between the element mounting area and the external connection area in the light emitting device 100 is defined by the outer edge of the frame 41. However, if no frame is formed on the substrate, there is no clear boundary between the element mounting area and the external connection area.

Figure 3:
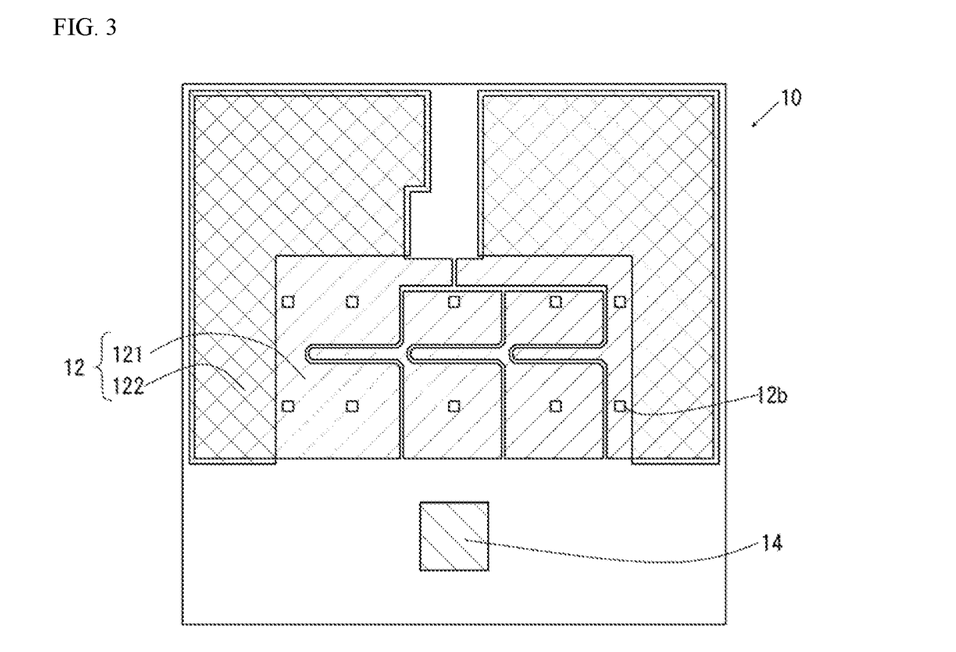
FIG. 3 is a plan view schematically showing the first wiring layer and the second wiring layer on the substrate in the embodiment of the light emitting device of the present disclosure.

As shown in FIG. 3, the planar shape of the wiring component 12 may be such that the planar shapes of the wiring components forming a pair are mutually different, so as to correspond to the electrode shape, the layout, etc., of the light emitting element 20, and to recognize whether an external connection terminal is positive or negative. That is, although the wiring component 12 has at least a pair of wiring components, the planar shapes of the paired wiring components may be different shapes.

In the external connection area, the wiring component 12 preferably extends from the element mounting area and is disposed close to the end of the base 11 (that is, near the outer edge of the main surface on which the wiring component 12 is disposed). Increasing the planar area of the wiring component 12, and in particular making it longer than the boundary between the element mounting area and the external connection area, allows current to flow more easily, and allows a light emitting device with low electrical resistance to be obtained. Here, "close to the end" means that the distance from the outer edge of the main surface on which the wiring component 12 is disposed to the wiring component 12 is from 0.01 mm to 0.5 mm.

Furthermore, disposing the wiring component 12 near the end of the base makes it possible to shorten the connection length of the wire or other power feed member used for feeding power to the external connection portion, and allows power to be fed reliably and easily. It is especially preferable in the case that the pair of positive and negative external connection portions in a substrate that is substantially rectangular in plan view each have a shape that extends toward one side of the rectangle. Consequently, the power feed members from the outside can be connected at about the same length and from the same direction for both of the positive and negative external connection portions. Furthermore, it is more preferable for each of the two positive and negative wiring components to have a shape that extends toward the other two sides facing each other. As a result, in the case that connecting a plurality of light emitting devices 100 adjacent to each other, for example, the distance between the external connection portions of the adjacent light emitting devices will be shorter, so the length of the power feed members connecting the light emitting devices can be shortened.

In the wiring component 12, the first wiring layer 121 and the second wiring layer 122, which is made of a different material from that of the first wiring layer 121, are stacked in that order starting from the base 11 side. Here, in the case of a single-layer structure, the term "different material" includes materials in which some of the elements are the same while some of the elements are different, and in the case of a stacked structure, this term encompasses materials in which some of the layers are the same while other layers are different, those in which the stacking order is different, and so on.

The first wiring layer 121 and the second wiring layer 122 may be formed of, for example, a single layer or a stacked layer of a metal such as Al, Au, Pt, Ti, Cu, Pd, Rh, Ni, W, Mo, Cr, Ag, or an alloy thereof. Moreover, an electroconductive materials other than metals such as ITO may be used.

In the element mounting area, the wiring component 12 includes the first wiring layer 121 that is not covered by the second wiring layer 122, and the light emitting element 20 is mounted on the first wiring layer 121. The outermost surface of the first wiring layer 121 is preferably a layer containing gold. Gold is usually used for the electrodes of the light emitting element 20, so connection reliability with the light emitting element 20 is improved by making the outermost surface of the first wiring layer 121 a layer containing gold. Gold-to-gold connections are very reliable, so a reliable connection can be maintained over an extended period without degradation due to the application of high voltage. More specifically, the first wiring layer 121 can be formed by a single-layer film of gold or a stacked film such as Ti/Pd/Au, Ti/Pt/Au, Ti/Rh/Au, W/Pt/Au, Rh/Pt/Au, Ni/Pt/Au, Ti/Rh/Au, and the like in that order starting from the base 11 side. The total thickness of the first wiring layer 121 is preferably at least 1.0 more preferably at least 3.0 in consideration of peeling of the first wiring layer due to impact during element mounting. In particular, in the case that the outermost surface is gold, the thickness of the gold is preferably at least 2.0 The total thickness of the first wiring layer 121 is preferably about 10.0 µm or less. A thickness such as this allows the desired layer to be formed in an appropriate film formation time, and helps keep the film formation time and material cost down.

In the external connection area, the wiring component 12 has the first wiring layer 121 and the second wiring layer 122, in that order starting from the base 11 side. A power feed member is connected to the second wiring layer from the outside. The outermost surface of the second wiring layer 122 is preferably a layer containing copper or aluminum, for example, and more preferably a layer containing aluminum. In the case that the outermost surface of the second wiring layer is a layer containing aluminum or the like, a wire or the like of aluminum or the like can be used as the power feed member to the light emitting device 100. Aluminum is preferable as the power feed member because it is less expensive than gold and can be easily joined with just ultrasonic waves, without any heat treatment.

From the standpoint of connection reliability, it is preferable to use the same metal material for the power feed member as that of the outermost surface layer of the wiring component 12. With a connection by different metal materials, the different metals diffuse into each other to form an alloy layer, but depending on the combination of metal materials, there is the risk that the alloy layer may become brittle as the diffusion proceeds, leading to connection failure. However, by using the same metal material for the outermost surface of the second wiring layer 122 and the power feed member, a more secure connection can be ensured over an extended period of time because this avoids the alloying and deterioration of the metal at the connection site caused by heat generated by the light emitting element in particular. More specifically, this layer can be formed by a single-layer film of aluminum and copper, or a stacked film such as Ti/Al, Ti/Cu, Ni/Al, Ti/Cu and the like, in that order starting from the first wiring layer side. The total thickness of the second wiring layer 122 is preferably at least 1.0 µm, and more preferably at least 4.0 µm. In particular, in the case that an aluminum layer is used for the outermost surface, in view of the fact that aluminum is a soft metal and peeling may be caused by impact during joining of the power feed member, the thickness of the aluminum layer is preferably at least 3.0 µm. Also, the total thickness of the second wiring layer is preferably about 10.0 µm or less in consideration of the appropriate film formation time, material cost, and so forth.

The substrate 10 may further have wiring components for electrically connecting to the light emitting elements 20, according to the number of the light emitting elements 20 to be mounted between the above-mentioned pair of wiring components 12. For example, one or more relay-use wiring components may be arranged between the pair of wiring components 12. The shape and layout of the wiring components disposed between the pair of wiring components 12 may be such that a plurality of light emitting elements are independently driven according to the shape of the pair of wiring components 12, the power supply control thereof, and so forth, or such that drive is performed in series, in parallel, or in a combination thereof.

Figure 1B:
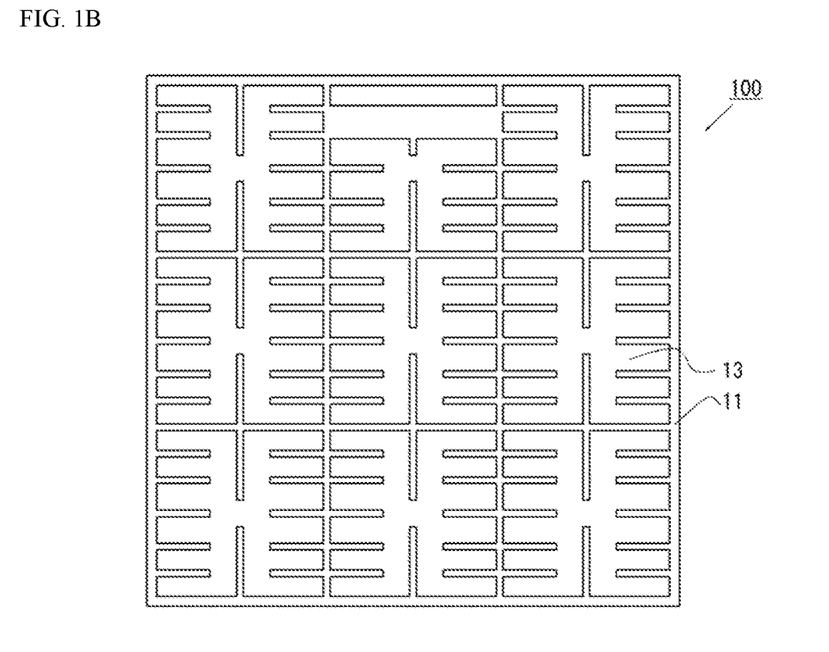
FIG. 1B is a bottom view schematically showing the light emitting device according to an embodiment of the present disclosure.

In the light emitting device 100, the substrate 10 may have a heat dissipater 13 on the second main surface on the opposite side from the main surface of the base. It is preferable for the heat dissipater 13 to be provided overlapping the area directly below the light emitting element. It is also preferable for the plan view shape of the heat dissipater 13 to have a larger surface area. Here, as shown in FIG. 1B, the heat dissipater 13 has a shape that combines a plurality of shapes in which a rectangular pattern is cut out into a comb shape. With a shape such as this, it is possible to minimize the generation of voids, and keep any voids from becoming larger, in the case that using a metal paste as a joining material during secondary mounting of the light emitting device 100. Consequently, joinability is stabilized, and good heat dissipation can be achieved, including in secondary mounting.

The heat dissipater 13 can be made from the same metal material as the wiring component 12.

The light emitting device 100 may have a recognition mark 14 on its top surface. The recognition mark 14 is provided between the outer edge of the frame 41 and the side of the outer edge of the substantially rectangular base 11 to which the wiring component 12 does not extend. The recognition mark 14 can be used for position recognition of the light emitting surface of the light emitting device in the secondary mounting of the light emitting device, position recognition in forming the resin frame 41 in the manufacturing process, and so forth. The recognition mark 14 can be formed using the same metal material as the wiring component 12. It is particularly preferable in the case that the surface of the recognition mark 14 is formed from the same material as the second conductive layer 122. In the case that the same material is used for the recognition mark 14, the surface of the wiring component 12 disposed in the external connection area can minimize metal corrosion attributable to the potential difference between different metal materials.

Method for Forming Wiring Component

The wiring component 12 can be formed using any method known in this field. Examples include the following methods (i) to (iii), and methods that combine parts of these.

(i) A method in which a first wiring film that will constitute the first wiring layer is formed on the main surface of the base, and a first wiring layer mask is used to etch the first wiring film into a specific shape to form the first wiring layer. Next, a second wiring film that will constitute the second wiring layer is formed on the base on which the first wiring layer was formed, and a second wiring layer mask is used to etch the second wiring film into a specific shape to form the second wiring layer.

(ii) A method in which a first wiring layer and a second wiring layer are formed in that order on the main surface of the base, and a first wiring layer mask and a second wiring layer mask are used to sequentially etch the second wiring layer and the first wiring layer into a specific shape.

(iii) A method in which a first wiring film is formed on the main surface of the base using a first wiring layer mask that opens in the shape of the first wiring layer, and the first wiring film on the first wiring layer mask is removed by lift-off to form the first wiring layer in a specific shape. Next, a second wiring layer mask that opens in the shape of the second wiring layer is formed on the base on which the first wiring layer was formed, a second wiring film is formed over this, and the second wiring film on the second wiring layer mask is removed by lift-off to form the second wiring layer in a specific shape.

The first wiring film and the second wiring film can be formed by vapor deposition, sputtering, CVD, ALD, or another known method. The mask can be formed by photolithography, printing, or the like.

If the light emitting device 100 includes the recognition mark 14, the second wiring layer and the recognition mark can be formed simultaneously by using a second wiring mask provided with a pattern of the recognition mark.

Light Emitting Element

A light emitting diode is usually used as the light emitting element 20.

The light emitting element 20 can be appropriately selected depending on the intended use, such as the composition, emission color or wavelength, size, and number of the elements. For example, nitride-based semiconductors ($In_xAl_yGa_{1-x-y}N$, $0 \leq X$, $0 \leq Y$, $X+Y \leq 1$) are used for blue and green light emitting elements, GaAlAs, AlInGaP are used for red light emitting elements.

The light emitting element 20 is usually formed by stacking a semiconductor layer on a support substrate (such as sapphire or another such translucent substrate). The substrate may have unevenness on the joining surface with the semiconductor layer. This allows the critical angle in the case that light emitted from the semiconductor layer hits the substrate to be intentionally varied, and allows light to be easily extracted to the outside of the substrate.

In the light emitting element 20, the support substrate may be removed after the semiconductor layer has been stacked This removal can be accomplished, for example, by polishing, LLO (laser lift-off), or the like.

The light emitting element 20 preferably has a pair of positive and negative electrodes on the same surface. This allows the light emitting element to be flip-chip mounted on the mounting substrate. In this case, the surface opposite the surface on which the pair of electrodes is formed serves as the main light extraction surface. In flip-chip mounting, the light emitting element and the wiring component on the base are electrically connected by using a paste-form, electro-conductive joining member such as solder, a thin-film joining member, or a bump-form joining member.

Alternatively, in the case of surface-up mounting, the surface on which the pair of electrodes is formed may be used as the main light extraction surface.

The light emitting element 20 may have the positive and negative electrodes on different surfaces. In the case of a light emitting element having a counter electrode structure in which the positive and negative electrodes are provided on opposite surfaces, the lower surface electrode is fixed to the wiring component on the base with a conductive member, and the upper surface electrode is connected to the base with a conductive wire or the like. In any case, the surface of the light emitting element 20 on the opposite side from the surface across from the substrate 10 can serve as the upper surface, and the upper surface can serve as the main light extraction surface.

The outermost surface of the positive and negative electrodes of the light emitting element 20 is preferably gold. Gold is chemically stable and ensures long-term reliability of the electrical connection. Also, as described above, in the case that the outermost surface of the first wiring layer is a layer containing gold, a connection can be made with the same material as the first wiring layer, in particular, gold-gold, so a more reliable connection can be obtained.

Although one light emitting element 20 may be provided in one light emitting device, a plurality of light emitting elements 20 may be included. When a single light emitting device includes a plurality of light emitting elements, it is preferable for the light emitting elements to be arranged and joined on the substrate 10. The light emitting elements may be disposed, for example, in a row or in a matrix. The number and planar shape of the light emitting elements can be appropriately set as dictated by the characteristics, size, and so forth of the light emitting device to be obtained.

The light emitting elements to be arranged are preferably close to each other, and the distance between the light emitting elements is preferably less than the size of the light emitting elements themselves (such as their length along one side), and more preferably no more than about 30% of the size of the light emitting elements themselves, and even more preferably no more than about 20% in consideration of an automotive application, and furthermore the luminance distribution at the light emitting surface of the light emitting devices. Disposing the light emitting elements close to each other in this way affords a light emitting device with a planar light source having more uniform light emission.

The mounting of the light emitting element 20 on the substrate 10 is usually performed via a joining member 60. Examples of the joining member here include solders such as those based on tin-bismuth, tin-copper, tin-silver, gold-tin, or the like; alloys whose main components are gold and tin, alloys whose main components are gold and germanium, and other such eutectic alloys; silver, gold, palladium, and other such conductive pastes and bumps; ACP, ACF, and other such anisotropic conductive materials; low-melting point metal brazes; conductive adhesives that are a combination of these; and conductive composite adhesives.

It is especially preferable for the light emitting element 20 to be mounted on the wiring component 12 by a joining member 60 that contains gold, and it is even more preferable for each electrode of the light emitting element to be joined to each of the pair of wiring components 12 by a joining member containing gold. If the outermost surface of the first wiring layer is a layer having a layer containing gold, the use of a joining member containing gold will more reliably ensure stable connection over an extended period of time.

Translucent Member

The translucent member 30 is disposed on the upper surface side of the light emitting element 20. The translucent member 30 is joined to the upper surface of the light emitting element. The translucent member 30 has an upper surface and a lower surface, the light emitted from the light emitting element is incident from the lower surface, the upper surface serves as the light extraction surface, and the light is emitted from the upper surface to the outside. The translucent member is preferably a member that transmits at least 60% of the light emitted from the light emitting element, for example.

The lower surface of the translucent member 30 preferably covers the entire upper surface of the light emitting element 20 in order to efficiently extract the light emitted from the light emitting element 20. That is, it is preferable for the upper surface of the light emitting element 20 to be covered so as to be encompassed by the lower surface of the translucent member 30, as viewed from the upper surface side of the translucent member 30. Furthermore, it is preferable for the surface area of the upper surface of the translucent member 30 to be smaller than the sum of the surface areas of the upper surfaces of the one or more light emitting elements provided to the light emitting device 100. This allows the emitted light from the light emitting element 20 incident from the lower surface of the translucent member 30 to exit from the upper surface of the translucent member 30 (that is, the light emitting surface of the light emitting device 100), which has a smaller surface area. That is, with the light emitting device 100, the light emitted from the light emitting element is narrowed by the translucent member 30, which makes it brighter and allows it to illuminate farther.

The translucent member 30 may cover the plurality of light emitting elements individually, or may integrally cover the plurality of light emitting elements.

It is preferable for the outer peripheral side surface of the translucent member 30 to be covered by the covering member 40.

The thickness of the translucent member 30 can be about 50 µm to 300 µm.

In the case that a single light emitting device has a plurality of translucent members, the upper surfaces of the translucent members are preferably flush or substantially flush. This allows interference of the light emitted from the side surfaces of the translucent members to be prevented more reliably. On the other hand, regardless of the number of translucent members, their upper surfaces may have any of various shapes, such as a concavo-convex shape, a curved surface, and a lens shape. The lower surface of the translucent member is preferably a plane parallel to the light extraction surface of the light emitting element.

The translucent member 30 can contain a light diffusing material or a phosphor capable of converting the wavelength of at least part of the light incident from the light emitting element 20. Examples of a translucent member 30 containing a phosphor include a sintered phosphor, and a resin, glass, or other such inorganic substance to which a phosphor powder has been added. A sintered phosphor may be formed by sintering just a phosphor, or may be formed by sintering a mixture of a phosphor and a sintering aid. In the case that sintering a mixture of a phosphor and a sintering aid, it is preferable to use an inorganic material such as silicon oxide, aluminum oxide, or titanium oxide as the sintering aid. This will suppress the discoloration or deformation of the sintering aid caused by light or heat, even if the light emitting element 20 has a high output. The higher is the transmissivity of the translucent member 30, the better the light will be reflected at the interface with the covering member 40, so brightness can be improved.

The phosphor that is added to the translucent member 30 is a substance that can be excited by the light emitted from the light emitting element 20. For example, one of the specific examples shown below can be used alone, or two or more can be used in combination. Specific examples of phosphors that can be excited by a blue light emitting element or an ultraviolet light emitting element include yttrium-aluminum-garnet (YAG)-based phosphors activated by cerium, lutetium-aluminum-garnet (LAG)-based phosphors activated by cerium, nitrogen-containing calcium aluminosilicate ($CaO—Al_2O_3—SiO_2$)-based phosphors activated by europium and/or chromium, silicate (($Sr, Ba)_2SiO_4$)-based phosphors activated by europium, β-sialon phosphors, nitride-based phosphors such as CASN-based or SCASN-based phosphors, KSF-based phosphors ($K_2SiF_6$:Mn), sulfide-based phosphors and quantum dot phosphors. Light emitting devices of various colors (such as a white light emitting device) can be manufactured by combining a phosphor with a blue light emitting element or an ultraviolet light emitting element. If the light emitting device is intended to emit white light, the emission is adjusted to white by varying the type and concentration of the phosphor contained in the translucent member. When a phosphor is thus added to the translucent member 30, it is preferable for the concentration of the phosphor to be about 5 to 50%, for example.

The translucent member 30 is joined so as to cover the upper surface (that is, the light extraction surface) of the light emitting element 20. This can be accomplished, for example, by joining via a light guide member 50. Also, instead of using the light guide member 50 in the joining of the translucent member 30 and the light emitting element 20, direct joining by pressure bonding, sintering, surface activation joining, atomic diffusion joining, or hydroxyl group joining may be used.

The translucent member is usually disposed on the upper surface of the light emitting element, but depending on its form, it may cover part of the wiring component. That is, it may cover part of the first wiring layer and/or part of the second wiring layer.

Frame

Figure 4:
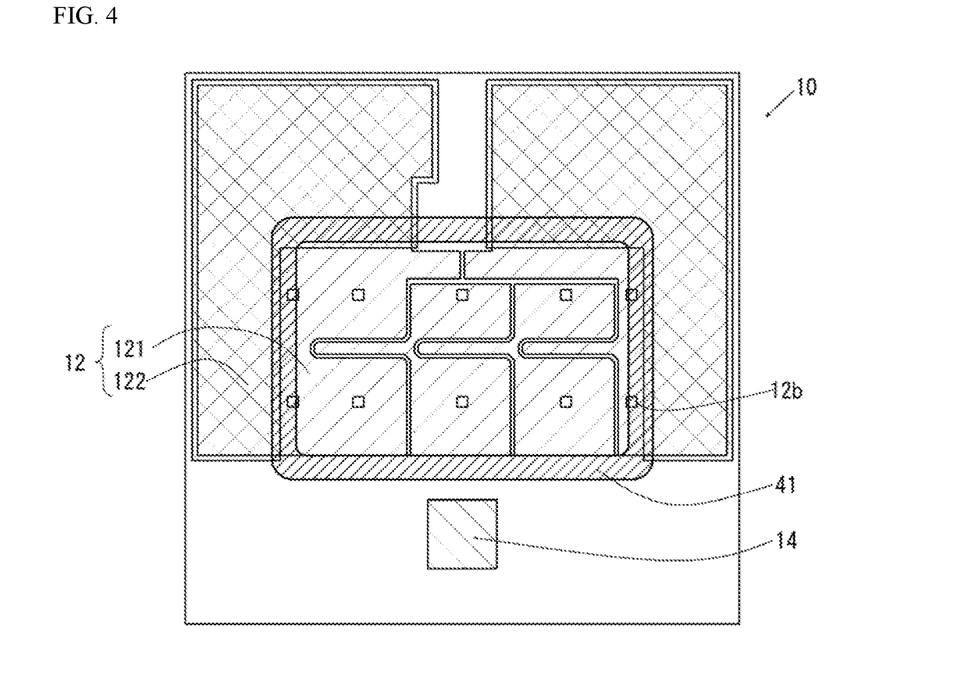
FIG. 4 is a plan view schematically showing the positional relation between the frame and the wiring component in FIG. 3.

The frame 41 is disposed on the substrate 10 so as to surround the light emitting element 20. In plan view, the outer edge of the frame 41 encompasses the boundary between the first wiring layer 121 and the second wiring layer 122. Furthermore, the frame 41 is preferably disposed so as to cover the boundary between the first wiring layer and the second wiring layer on the outermost surface of the wiring component 12 as shown in FIG. 4. The result of this is that the frame 41 covers the step between the surface of the first wiring layer and the surface of the second wiring layer, the contact surface area with the frame 41 is increased, and the step can exhibit an anchor effect.

The frame 41 is provided away from the outer edge of the upper surface of the substrate 10. Consequently, in the process of manufacturing the light emitting device 100, the frame 41 and the covering member 40 are not disposed on the dicing line in the case that the grouped light emitting devices 100 are separated into individual light emitting devices 100. That is, since the resin member is not cut during this separation, shape changes in the resin member, peeling from the substrate, and so forth attributable to the stress during cutting can be suppressed.

The frame 41 is formed from an insulating member since it covers part of the wiring component 12. For example, an insulating resin member can be used for the frame 41. More specifically, a silicone resin, modified silicone resin, epoxy resin, modified epoxy resin, acrylic resin, hybrid resin containing one or more of these resins, or the like can be used. Furthermore, a filler such as a light reflective substance can be contained in these resins. Examples of light reflective substances include titanium oxide, silicon oxide, zirconium oxide, potassium titanate, alumina, aluminum nitride, boron nitride, and mullite.

In the light emitting device 100 according to this embodiment, the wettability of the surface of the first wiring layer 121 with respect to the resin material is preferably higher than the surface of the second wiring layer 122.

Consequently, in the case that the frame 41 is formed from a resin material, for example, the resin component that oozes out from the resin material will be less likely to wet and spread over the wiring component 12 (more specifically, the surface of the second wiring layer) in the external connection area.

As described above, the outermost surface of the first wiring layer 121 is preferably a layer containing gold. The surface of the first wiring layer using gold as the outermost surface has good wettability such as solder and is excellent in connection reliability with the joining member 60. On the other hand, since the wettability is good, the resin component exuded from the resin material is also easily wetted and spread. However, in the light emitting device 100 according to the present embodiment, since the interface between the first wiring layer 121 and the second wiring layer 122 is encompassed by the outer edge of the frame 41, it is less likely that the resin component during formation of the frame 41 will wet and spread over the external connection area.

In the external connection area, it is preferable for all of the first wiring layer 121 to be covered by the second wiring layer 122. That is, it is preferable for the outermost surface of the wiring component 12 in contact with the outer edge of the frame 41 to be only the second wiring layer 122. In this case, the outermost surface of the second wiring layer 122 is preferably a metal layer other than gold. In the air, metals other than gold are susceptible to the formation of an oxide film on their surface, and the wettability of a metal on which an oxide film has formed tends to be worse. Therefore, disposing the second wiring layer 122 at a position in contact with the outer edge of the covering member 40 makes it possible to suppress the wetting and spreading of the resin component.

That is, in the case that the first wiring layer 121, which has better wettability than the surface of the second wiring layer 122, is disposed to the inside of the outer edge of the frame 41, the wetting and spreading of the resin component to the external connection area can be suppressed. As a result, it is possible to suppress improper joining or the like between the power feed member and the wiring component located in the external connection area, which would otherwise be caused by the wetting and spreading of the resin component during formation of the frame and the covering member. From these standpoints, it is preferable for the frame 41 to be disposed such that the entire outer edge thereof is in contact with the second wiring layer 122 or the base 11.

When the frame 41 is disposed in contact with the first wiring layer, the first wiring layer 121 preferably has a groove or hole 12b on the surface in the area that is in contact with the frame 41. The base 11 is preferably exposed at the bottom of the hole 12b. This improves adhesion between the frame 41 and the substrate 10, and results in a light emitting device 100 with excellent reliability.

Frame Formation Method

The frame 41 is formed, for example, by disposing the nozzle of a resin discharge device above the substrate 10, and discharging the uncured resin material from the tip of the nozzle onto the substrate 10 while moving the nozzle at least once around the light emitting element. The uncured resin material discharged from the nozzle wets and spreads over the substrate 10 and is then cured to form a frame 41 having a substantially semicircular cross sectional shape on the substrate 10. Furthermore, a plurality of layers of the frame 41 can be stacked obtain a frame 41 having the desired height by moving the nozzle a plurality of times around.

The frame 41 is preferably formed so that the height from the upper surface of the substrate 10 to the top of the frame 41 is lower than the light emitting surface of the light emitting device 100. For example, in the case that the light emitting device 100 has the translucent member 30, the top of the frame 41 is preferably higher than the upper surface of the light emitting element 20 mounted on the substrate 10, and lower than the upper surface of the translucent member. The effect of forming the frame 41 at such a height is that even if the distance is reduced between the light emitting element 20 and the inside surface of the frame 41, the sealing member 40 can be disposed inside the frame 41, without the covering member 40 covering the light emitting surface of the light emitting device 100. The height of the frame 41 is at least 150 μm and no more than 500 μm, for example.

The frame 41 may be formed by resin printing, transfer molding, compression molding, or another such method.

Covering Member

The light emitting device 100 has the covering member 40, which covers the light emitting element 20 and the first wiring layer 121, in the frame 41.

In the light emitting device 100, the covering member 40 reflects light heading other than to the upper surface of the translucent member 30, so that the light is emitted from the upper surface of the translucent member 30, and covers the side surfaces of the light emitting element 20 and the translucent member 30 to protect the light emitting element 20 from external force, dust, gas, and the like. The covering member 40 is provided so as to expose the upper surface of the translucent member 30 as the light emitting surface of the light emitting device 100 and to cover part of the upper surface of the 10 and the translucent member 30 and the light emitting element 20. This "covering" may involve another layer interposed between the covering member 40 and the translucent member 30, the light emitting element 20, and the substrate 10. An example of this other layer is the light guide member 50.

In the case that the upper surface of the light emitting element 20 is used as the light extraction surface of the light emitting device 100, the covering member 40 disposed between the light emitting elements is preferably substantially flush with the upper surfaces of the light emitting elements. In this Specification, the term "substantially flush" means that a difference of about ±10%, and preferably about ±5%, of the thickness of the covering member is permissible.

Alternatively, in the case that the upper surface of the translucent member 30 is used as the light extraction surface of the light emitting device 100, the upper surface of the covering member is preferably substantially flush with the upper surface of the translucent member.

Also, in the case that a plurality of translucent members 30 are respectively disposed on the upper surfaces of a plurality of light emitting elements 20, the covering member disposed between the translucent members is preferably substantially flush with the upper surfaces of the translucent members.

The covering member 40 can be formed from any material capable of reflecting the light emitted from the light emitting element 20. Consequently, the light emitted from the light emitting element is reflected at the interface between the light emitting element 20 and the covering member 40 into the light emitting element. As a result, the light propagates within the light emitting element and is finally emitted from the upper surface of the light emitting element to the upper surface of the light transmissive member and to the outside.

The covering member 40 can be formed form the same resin material as the frame 41 described above. The covering member 40 is preferably optically reflective since it covers the side surfaces of the light emitting element 20 and the translucent member 30, and a filler such as a light reflecting substance is preferably added to the above-mentioned resin material. Examples of the light reflective substance include titanium oxide, silicon oxide, zirconium oxide, potassium titanate, alumina, aluminum nitride, boron nitride and mullite. The amount in which the light reflecting substance is contained will affect the amount of reflection and transmission of light by the covering member 40, etc., and can therefore be adjusted appropriately according to the characteristics of the light emitting device to be obtained. For instance, the amount in which the light reflecting substance is contained is preferably at least 30 wt %.

The covering member can be molded by, for example, injection molding, potting molding, printing, transfer molding, compression molding, or the like.

Figure 2A:
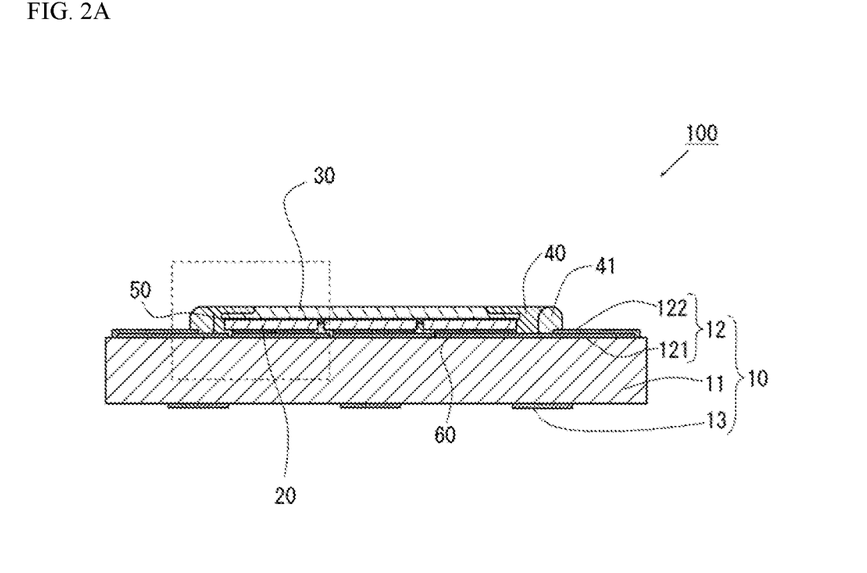
FIG. 2A is a cross-sectional view schematically showing a light emitting device taken along line II-II in FIG. 1A.
Figure 2B:
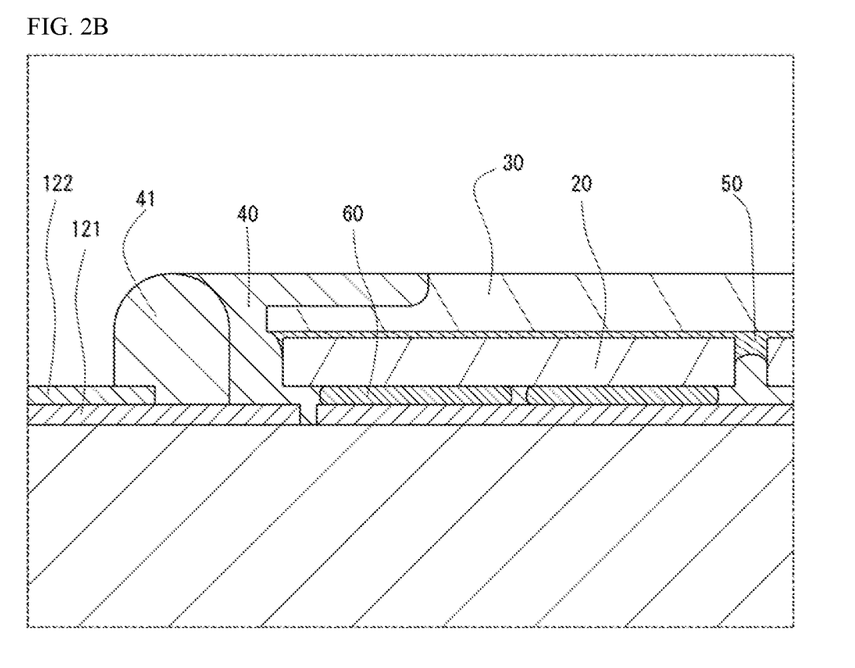
FIG. 2B is a detail view of the portion surrounded by the dotted line in FIG. 2A.

In the light emitting device 100, as described above, the translucent member 30 and the light emitting element 20 are joined via the light guide member 50, for example. The light guide member 50 is also interposed between the light emitting element and the translucent member to join them together. Furthermore, as shown in FIG. 2A, the light guide member 50 may cover all or part of the side surfaces of the light emitting element 20. In the case that part of the translucent member 30 is not opposite the upper surface that is the main light emission surface of the light emitting element, the light guiding member 50 is preferably formed so as to cover the part of the translucent member 30 that is not opposite the upper surface of the light emitting element. This allows the light guide member 50 to efficiently guide the light emitted from the upper surface and the side surface of the light emitting element 20 to the translucent member 30.

From the standpoint of easy handling and working, the light guide member 50 is preferably made from a resin material. This resin material can be the same resin material as that of the frame 41 described above. The light guide member 50 can be formed into the above-described shape by appropriately adjusting the viscosity of the resin material used to form the light guide member 50 and the wettability between the resin material and the light emitting element 20.

Other Members

The light emitting device may also be provided with other elements (such as the protection element 21) or electronic components. These elements and electronic components are preferably embedded in the covering member 40.

The light emitting device of the embodiments of the present invention can be used in a variety of light sources, such as light sources for a lighting, light sources for various kinds of indicators, a vehicle, a display, a liquid crystal backlight, automotive parts, signaling devices, outdoor channel letters, and electric signboards.

What is claimed is:

1. A light emitting device comprising:
   a substrate having a base and a wiring component disposed on a first main surface of the base;
   a light emitting element mounted on the wiring component; and
   a frame surrounding the light emitting element on the substrate, and having an inner edge and an outer edge on the substrate,
   the wiring component having
   a first wiring layer constituting at least a part of an outermost surface of the wiring component inside of the outer edge of the frame, and connected to the light emitting element, and
   a second wiring layer constituting at least a part of the outermost surface of the wiring component outside of the inner edge of the frame, and made from a different material from a material of the first wiring layer, at least a part of the second wiring layer overlapping the first wiring layer in a plan view, and at least a part of the outer edge of the frame being directly on the second wiring layer and at least a part of the inner edge of the frame being directly on the first wiring layer,
   a boundary between the first wiring layer and the second wiring layer on the outermost surface of the wiring component in plan view being disposed inside the outer edge of the frame.

2. The light emitting device according to claim 1, wherein the second wiring layer is stacked on the first wiring layer.

3. The light emitting device according to claim 1, wherein at least a part of an outer edge of the second wiring layer and at least a part of an outer edge of the first wiring layer are positioned outside of the outer edge of the frame with the part of the outer edge of the second wiring layer being positioned on an outer side of the part of the outer edge of the first wiring layer.

4. The light emitting device according to claim 1, wherein the frame includes a resin material, and
   wettability of the surface of the first wiring layer with respect to the resin material is higher than wettability of the surface of the second wiring layer with respect to the resin material.

5. The light emitting device according to claim 1, further comprising
a covering member covering the light emitting element and the first wiring layer inside the inner edge of the frame.

6. The light emitting device according to claim 5, further comprising
a protection element embedded in the covering member.

7. The light emitting device according to claim 1, wherein the first wiring layer includes an outermost layer containing gold.

8. The light emitting device according to claim 7, wherein the light emitting element is mounted on the wiring component by a joining member containing gold.

9. The light emitting device according to claim 1, wherein the second wiring layer includes an outermost layer containing copper or aluminum.

10. The light emitting device according to claim 1, wherein
the substrate has a heat dissipater on a second main surface on an opposite side of the first main surface of the base.

11. The light emitting device according to claim 10, wherein
the heat dissipater overlaps an area directly below the light emitting element in plan view.

12. The light emitting device according to claim 1, wherein
the heat dissipater has a shape that combines a plurality of shapes in each of which a rectangular pattern is cut out into a comb shape.

13. The light emitting device according to claim 1, wherein
a height of the frame is at least 150 μm and no more than 500 μm.

14. The light emitting device according to claim 1, wherein
the light emitting element is mounted on the wiring component by a joining member, and
an outermost layer of the first wiring layer and the joining member are made of the same material.

15. The light emitting device according to claim 1, wherein
the light emitting element includes an electrode mounted on the wiring component, and
an outermost layer of the first wiring layer and the electrode of the light emitting element are made of the same material.

16. The light emitting device according to claim 1, wherein
at least a part of the boundary between the first wiring layer and the second wiring layer on the outermost surface of the wiring component is arranged between the inner edge and the outer edge of the frame in plan view.

* * * * *